United States Patent [19]
Wei

[11] Patent Number: 5,719,875
[45] Date of Patent: Feb. 17, 1998

[54] SYSTEMATIC CONVOLUTION INTERLEAVERS AND DEINTERLEAVERS

[75] Inventor: Lee-Fang Wei, Lincroft, N.J.

[73] Assignee: Lucent Technologies Inc., Murray Hill, N.J.

[21] Appl. No.: 661,511

[22] Filed: Jun. 11, 1996

[51] Int. Cl.$^6$ .................................................. H03M 13/22
[52] U.S. Cl. ............................................ 371/2.1; 371/39.1
[58] Field of Search .............................. 371/2.1, 2.2, 39.1

[56] References Cited

U.S. PATENT DOCUMENTS

| | | | |
|---|---|---|---|
| 5,241,563 | 8/1993 | Paik et al. | 375/200 |
| 5,572,532 | 11/1996 | Fimoff | 371/2.2 |

OTHER PUBLICATIONS

Patent Application Serial No. 08/469,558, filed on Jun. 6, 1995 by D. Amrany, pending.
R. G. Gallager, "Information Theory and Reliable Communication," 286–290, John Wiley & Sons (1968).

*Primary Examiner*—Stephen M. Baker
*Attorney, Agent, or Firm*—Ronald D. Slusky; Henry T. Brendzel

[57] ABSTRACT

A systematic convolutional interleaver arrangement that is obtained by treating the input signals of an associated error correcting encoder as if they had been pre-interleaved in a very particular way so that the order of the input signals of the encoder is not altered when it is transmitted to the channel. By way of example, an interleaver/deinterleaver arrangement is disclosed that uses Reed Solomon code RS(120,116) and employs delay element banks and associated routing to interleave and deinterleave the signals.

15 Claims, 7 Drawing Sheets

|   | 0 | 2 | | 5 | | 120 |
|---|---|---|---|---|---|---|
| 1 | $C_{0,119}$ | $C_{0,118}$ | $\cdots$ | $C_{0,115}$ | $\cdots\cdots$ | $C_{0,0}$ |
| 2 | $C_{1,119}$ | $C_{1,118}$ | $\cdots$ | $C_{1,115}$ | $\cdots\cdots$ | $C_{1,0}$ |
| 3 | $C_{2,119}$ | $C_{2,118}$ | $\cdots$ | $C_{2,115}$ | $\cdots\cdots$ | $C_{2,0}$ |
| $\vdots$ | | | | | | |
| 30 | $C_{29,119}$ | $C_{29,118}$ | $\cdots$ | $C_{29,115}$ | $\cdots\cdots$ | $C_{29,0}$ |

SYSTEMATIC CONVOLUTION INTERLEAVERS AND DEINTERLEAVERS

BACKGROUND OF THE INVENTION

This invention relates to systematic convolutional interleavers and deinterleavers that are used in conjunction with error correcting coders in a communication or storage system.

Communication of signals invariably has to deal with transmission of signals through a channel where errors are introduced. FIG. 1 presents the block diagram of a prior art arrangement for such an environment, where the input signals are first applied to encoder 100, the encoded signals are passed on to interleaver 200, the interleaved signals are modulated in block 300 and the modulated signals are applied to the channel. The signals received from the channel are demodulated in block 400, deinterleaved in block 500 and lastly decoded in block 600 to recover the input signals into encoder 100. (In the present illustrative embodiments, each so-called "signal" is a digital signal comprising 8 data bits, but in other embodiments each signal may comprise any number of bits, including one bit. In many contexts, the "signal" may be understood to be a "symbol" of a so-called signal constellation.)

Interleaver 200 is interposed in the system in order to account for burst errors in the channel. Specifically, interleaver 200 disperses adjacent signals in time prior to modulation, so that burst errors with large number of errors in a short time span, do not affect too many of adjacent signals of the original uninterleaved signals. Conversely, when considering the signals coming from the channel, errors that are closely spaced in time to each other are interspersed at the output of the deinterleaver to be far apart from each other. The consequence of this dispersing is that decoder 600 is able to recover the input signals entered into encoder 100 by virtue of the error-correcting redundancy included in the signals which decoder 600 utilizes.

It is also well known that modulator 300 as well as demodulator 400 may be subsystems that themselves include coding and decoding. For example, modulator 300 may include a front end section that is a trellis encoder. Correspondingly, the tail-end of demodulator 400 would include a Viterbi decoder.

SUMMARY OF THE INVENTION

The co-pending, U.S. patent application of D. Amrany, Ser. No. 08/469,558 filed Jun. 6, 1995 discloses a systematic convolutional interleaver arrangement in which the input signals of an associated error correcting encoder are treated as if they had been pre-interleaved in a very particular way so that the order of the input signals of the encoder is not altered when it is transmitted to the channel. In the arrangements disclosed in the Amrany patent application, successive signals of each error correcting code codeword, e.g. a Reed-Solomon codeword, are separated in the interleaved stream by a constant amount equal to the so-called decoding depth. By contrast, in systematic convolutional interleaver arrangements embodying the principles of the present invention, that separation is not necessarily constant and, indeed, is greater than the decoding depth for at least certain successive ones of the signals comprising a particular codeword. This is advantageous in that, for example, the increased average separation of the signals comprising a particular codeword enhances the system's ability to withstand burst errors in the channel. In addition, if the interleaving which provides the aforesaid increased separation is carried out in a particular way, as described hereinbelow, the deinterleaving process can be advantageously implemented using actual delay lines, as opposed to random access memories which emulate delay lines. This is advantageous in that given a particular implementational technology, e.g., MOS circuitry, actual delay lines can be operated to provide higher throughput than a random access memory delay line emulations, thereby facilitating the use of the invention in high-data-speed applications.

DETAILED DESCRIPTION

Figures 1, 2:
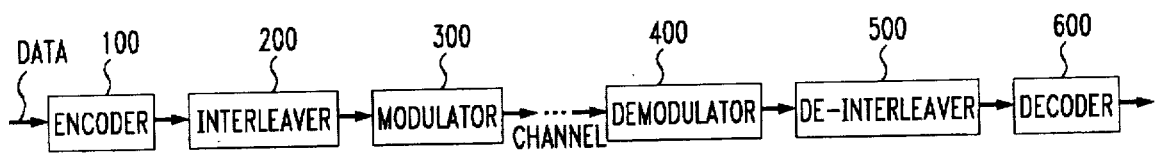
FIG. 1 shows a prior art coder/decoder arrangement with an interleaver and a deinterleaver interposed therebetween.
FIG. 2 depicts a prior art block interleaver.

FIG. 2 presents a simple implementation of a conventional block interleaver 200. When the interleaving arrangement seeks to interleave Reed-Solomon (RS) codewords of length 120 signals to a depth of 30 codewords, all that is needed is a matrix such as depicted in FIG. 2, which can be viewed to comprise 30 rows and 120 columns of signals. Interleaving is accomplished by writing incoming signals sequentially into the signals matrix and thus populating the matrix a row at a time. An interleaved output is obtained by reading signals out of the matrix a column at a time. Row 1, for example, consists of 120 signals $C_{0,119}, C_{0,118}, \ldots, C_{0,0}$ of the $0^{th}$ codeword. Correspondingly, column 1 consist of $C_{0,119}, C_{1,119}, \ldots, C_{29,119}$, which correspond to the first signals of the $0^{th}, 1^{st} \ldots$ and $29^{th}$ codewords. This arrangement is said to provide an interleaving depth of 30 signals because successive signals of the same codeword are caused to be 30 signals apart in the interleaved signal stream.

A block deinterleaver can be identical to the block interleaver of FIG. 2. The overall memory requirement for the interleaver and the deinterleaver, therefore, is at least 7,200 signals, and the overall delay between the input to the interleaver and the output of the deinterleaver is approximately 7,200 signal periods.

Figure 3:
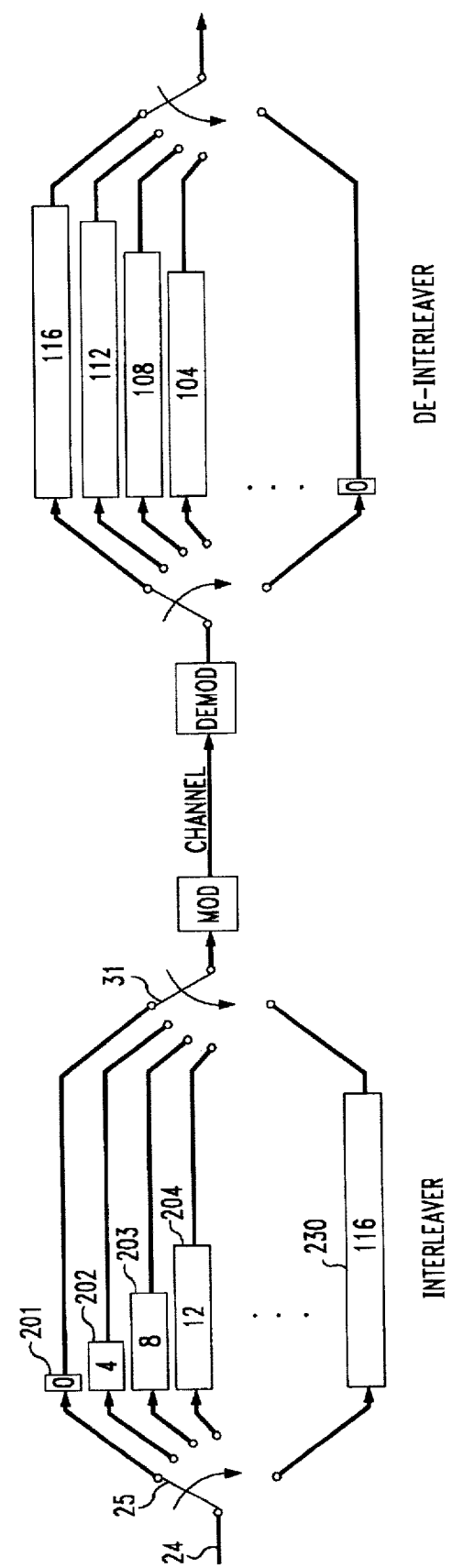
FIG. 3 shows a prior art convolutional interleaver and deinterleaver.

FIG. 3 presents a simple embodiment of a conventional convolutional interleaver and deinterleaver with the same interleaving depth of 30 signals. A convolutional interleaver is one where within any selected block of signals in the interleaved signal stream, there exists at least one codeword with some signals missing.

In FIG. 3, the incoming signals appear on line 24, switch 25 cycles through delay elements 201, 202, ... 230 (note that register 201 has zero delay and is, therefore, simply a connection), and successive signals on line 24 are applied to successive delay elements. Switch 31 at the output of the interleaver is synchronized with switch 25, resulting in an interleaved output emanating from switch 31. In particular, when the incoming signal stream to the FIG. 3 arrangement is $$C_{m,119}, C_{m,118}, C_{m,117}, \ldots C_{m,90}, C_{m,89}, \ldots$$

and where signal $C_{m,119}$ is stuffed into delay element 201, the output at switch 31 of FIG. 3 is $$C_{m,119}, C_{m-1,118}, C_{m-2,117}, \ldots C_{m-29,90}, C_{m,89}, C_{m-1,88}, \ldots$$

As can be observed from the above, signals that belong to the same RS codeword are separated at the output of switch 31 by at least 30 signals (e.g., $C_{m,119}$ and $C_{m,89}$).

FIG. 3 also shows a deinterleaver that performs the inverse operation of the convolutional interleaver. It may also be noted that the memory requirement and delay of the FIG. 3 interleaver/deinterleaver is considerably smaller than a corresponding FIG. 2 implementation. Specifically, only 3,480 signals of memory are needed, and the total interleaving/deinterleaving delay is also 3,480 signals.

The interleavers of FIGS. 2 and 3 are not "systematic" because the order of the input signals is altered by the interleaver. Non-systematic interleavers have a number of problems. First, the receiver cannot skip the deinterleaver if it chooses to skip the associated decoder. The deinterleaving delay, therefore, is not avoidable. Second, bursty errors that cannot be corrected by the decoder will be spread by the deinterleaver. It turns out that in various applications it is better to suffer a number of errors concentrated in time than to suffer the same number of errors over an extended time span. In such cases, therefore, spreading or dispersing of uncorrected errors is not desirable.

The conventional encoder-interleaver arrangement of FIG. 1 requires only a single encoder. In "Information Theory and Reliable Communication" by R. G. Gallager, John Wiley & Sons, 1968, pp. 286 et seq., a more complex arrangement is presented with a plurality of encoders. This plurality of encoders aims to replace the combination of the encoder and block interleaver of FIG. 1. Although no specific embodiment is depicted for the encoders or for any means for controlling the encoders, the Gallager depiction does suggest that a systematic block interleaver can be realized through the use of a switch at the input and a switch at the output of the plurality of encoders. It is not convolutional interleaving, however.

Figure 4:
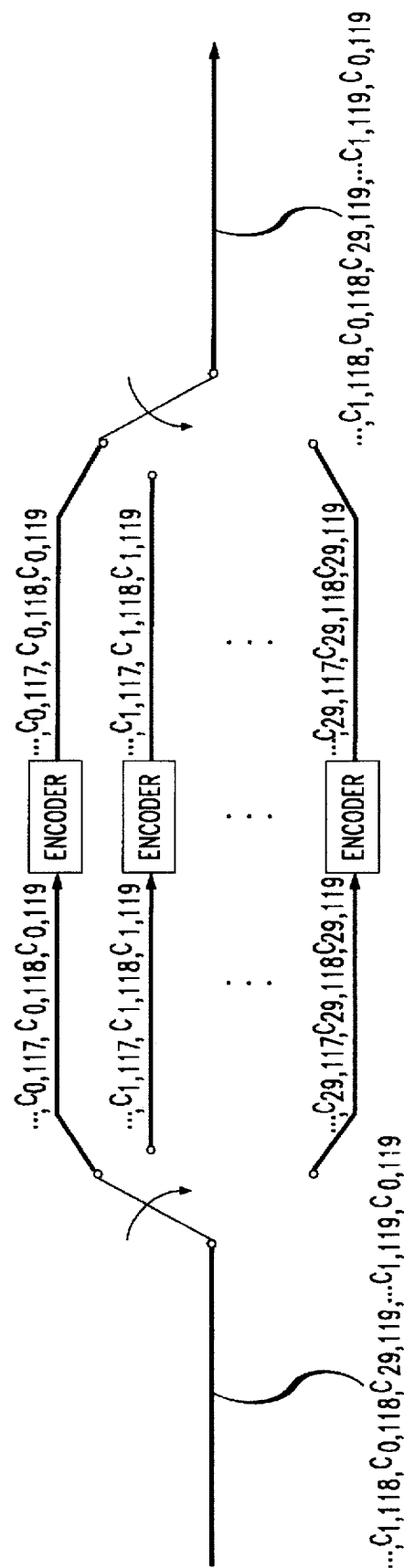
FIG. 4 illustrates a systematic block interleaver suggested by Gallager.

The Gallager structure, depicted in FIG. 4, presents a hardware and/or speed penalty at the decoder. In one decoding embodiment it appears that 30 separate decoders must be used, with the signals appropriately routed to those decoders. In another embodiment, it appears that a deinterleaver would need to be used first (like the one depicted in FIG. 2), followed by a very fast decoder. In either case, the decoder becomes commercially unattractive.

The challenge is to develop a systematic, convolutional, interleaver in order to avoid the two problems described above in connection with systematic block interleavers. Indeed, one such type of systematic, convolutional interleaver is described in the co-pending, U.S. patent application of D. Amrany, Ser. No. 08/469,558 filed Jun. 6, 1995. In the arrangements disclosed in the Amrany patent application, successive signals of each error correcting code codeword, e.g. a Reed-Solomon codeword, are separated in the interleaved stream by a constant amount equal to the so-called decoding depth. Indeed, such an approach is implemented in the interleaving scheme depicted in FIG. 8 hereof and described below.

By contrast, in systematic convolutional interleaver arrangements embodying the principles of the present invention, that separation is not necessarily constant and, indeed, is greater than the decoding depth for at least certain successive ones of the signals comprising a particular codeword. Thus assume that each RS codeword comprises 116 input signals and 4 redundant signals, and assume that the input signals come in the order of

| $C_{m,119}$, | $C_{m-1,115}$, | $C_{m-2,111}, \ldots,$ | $C_{m-28,7}$, |
|---|---|---|---|
| $C_{m,118}$, | $C_{m-1,114}$, | $C_{m-2,110}, \ldots,$ | $C_{m-28,6}$, |
| $C_{m,117}$, | $C_{m-1,113}$, | $C_{m-2,109}, \ldots,$ | $C_{m-28,5}$, |
| $C_{m,116}$, | $C_{m-1,112}$, | $C_{m-2,108}, \ldots,$ | $C_{m-28,4}$, |
| $C_{m+1,119}$, | $C_{m,115}$, | $C_{m-1,111}, \ldots,$ | $C_{m-27,7}$, |
| $C_{m+1,118}$, | $C_{m,114}$, | $C_{m-1,110}, \ldots,$ | $C_{m-27,6}$, |
| $C_{m+1,117}$, | $C_{m,113}$, | $C_{m-1,109}, \ldots,$ | $C_{m-27,5}$, |
| $C_{m+1,116}$, | $C_{m,112}$, | $C_{m-1,108}, \ldots,$ | $C_{m-27,4}, \ldots$ |

Conceptually, one can immediately add the 4 RS redundant signals to the above stream (which can be thought to be null at this point) to result in the stream

| $C_{m,119}$, | $C_{m-1,115}$, | $C_{m-2,111}, \ldots,$ | $C_{m-28,7}$, | $C_{m-29,3}$, |
|---|---|---|---|---|
| $C_{m,118}$, | $C_{m-1,114}$, | $C_{m-2,110}, \ldots,$ | $C_{m-28,6}$, | $C_{m-29,2}$, |
| $C_{m,117}$, | $C_{m-1,113}$, | $C_{m-2,109}, \ldots,$ | $C_{m-28,5}$, | $C_{m-29,1}$, |
| $C_{m,116}$, | $C_{m-1,112}$, | $C_{m-2,108}, \ldots,$ | $C_{m-28,4}$, | $C_{m-29,0}$, |
| $C_{m+1,119}$, | $C_{m,115}$, | $C_{m-1,111}, \ldots,$ | $C_{m-27,7}$, | $C_{m-28,3}$, |
| $C_{m+1,118}$, | $C_{m,114}$, | $C_{m-1,110}, \ldots,$ | $C_{m-27,6}$, | $C_{m-28,2}$, |
| $C_{m+1,117}$, | $C_{m,113}$, | $C_{m-1,109}, \ldots,$ | $C_{m-27,5}$, | $C_{m-28,1}$, |
| $C_{m+1,116}$, | $C_{m,112}$, | $C_{m-1,108}, \ldots,$ | $C_{m-27,4}$, | $C_{m-28,0}, \ldots$ |

Figure 5:
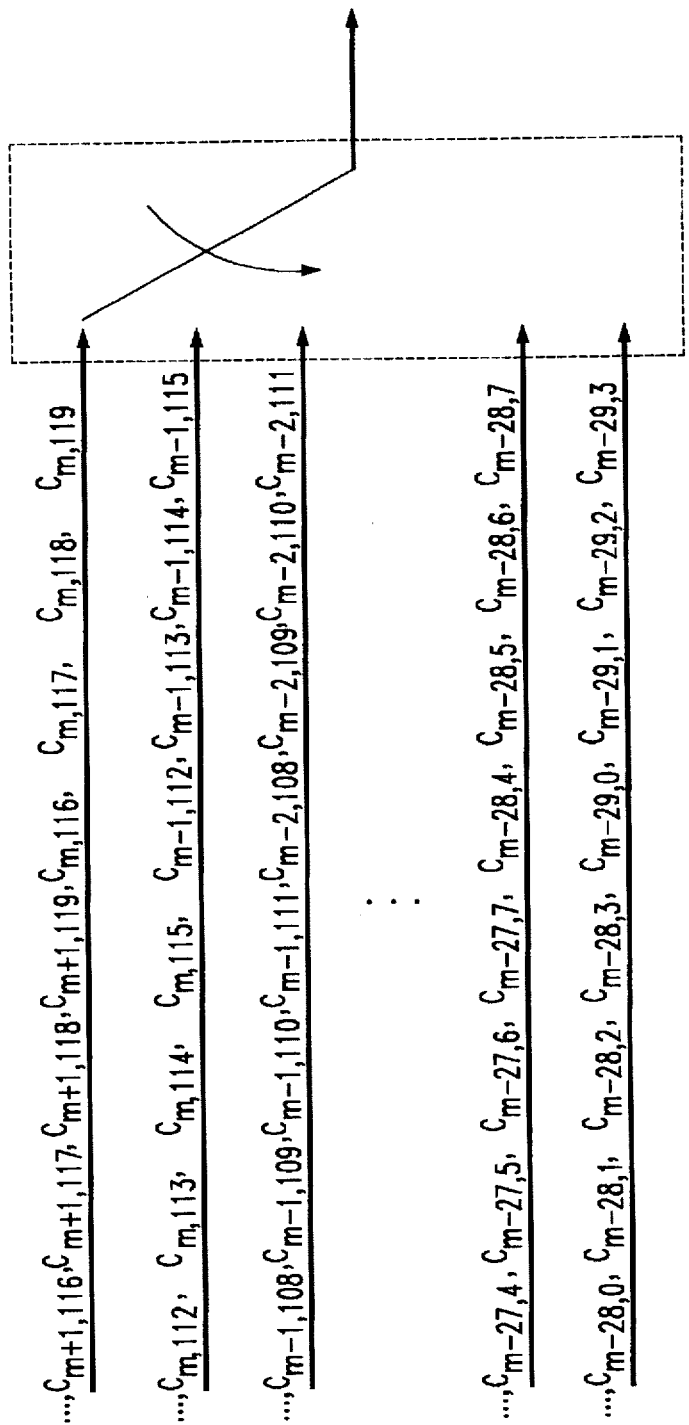
FIG. 5 presents a pictorial overview of an illustrative stream of incoming Reed-Solomon codeword signals, pursuant to an illustrative embodiment of the invention.

A pictorial view of this stream is presented in FIG. 5. It is depicted in the form of 30 parallel signal paths, or "rails," that have been multiplexer onto a single stream through a switch that cyclically connects to all of the signal paths.

In accordance with the principles disclosed herein, given the assumed significance of these signals vis-a-vis their relationships to each other and to the RS codewords, appropriate routing of the signals to a plurality of coders, and routing of the plurality of coded signals into a single stream of output signals yields, in effect, a systematic convolutional interleaver.

Figure 6:
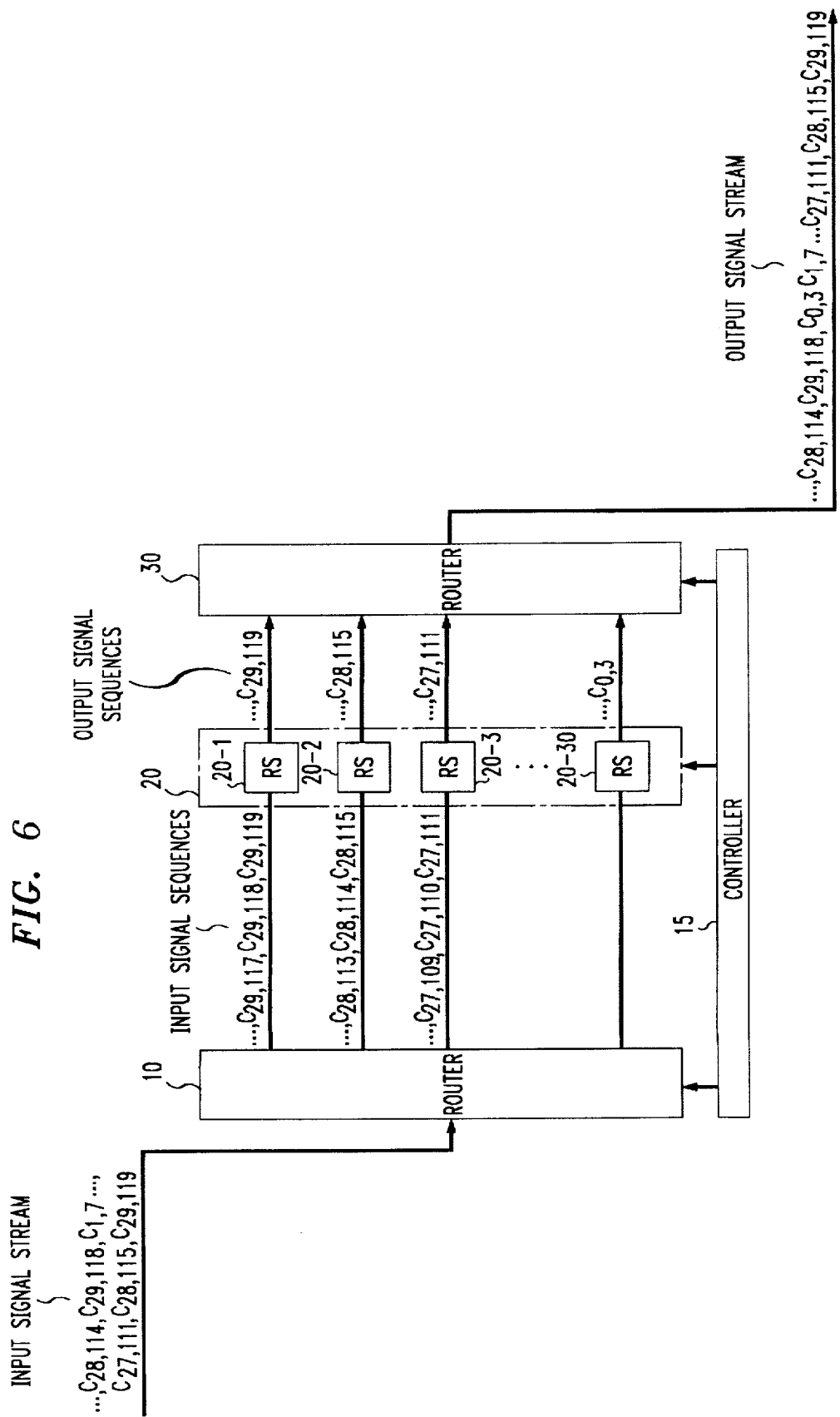
FIG. 6 provides a systematic convolutional interleaver for the signal stream of FIG. 5.

FIG. 6 presents a structure that is responsive to the specific signal stream described above. While it is similar to the structure shown in FIG. 4, it routes the input signals differently, and achieves a highly improved result.

In FIG. 6, the input signal stream is applied to router 10 which comprises a switch that, responsive to control signals from controller 15, distributes the incoming signals to its 30 outputs. Each output of router 10 is coupled to a corresponding Reed-Solomon (RS) coder 20-j and the outputs of the 30 RS coders are routed to a common output port through router 30. Router 30 and the RS coders are also responsive to controller 15 which implements the routing procedure described below.

In operation, router 10 needs to cycle through RS coders 20-1 through 20-29 for 4 cycles, while skipping RS coder 20-30. During those 4 cycles, RS coder 20-30 receives no input (or the null input of $C_{0,3}$, $C_{0,2}$, $C_{0,1}$, and $C_{0,0}$) and router 30 cycles through RS coders 20-1 through 20-30 for the 4 cycles. Thereafter, router 10 cycles through RS coder 20-30 through 20-28 for 4 cycles while skipping coder 20-29 and router 30 cycles through RS coders 20-30 through 20-29 for the 4 cycles, and so the process continues.

If it is assumed that $C_{29,119}$, is inserted into RS coder 20-1 then, according to the description above, the next three samples that are inserted into RS coder 20-1 are $C_{29,118}$, $C_{29,117}$, and $C_{29,116}$. At the end of those 4 cycles, when $C_{1,4}$ is inserted into RS coder 20-29, the cycling sequence of router 10 is altered and the next clock advances the routing to RS coder 20-30. At that point, the RS coder 20-30 is reset and, according to the description set forth above, the $C_{30,119}$, is entered into RS coder 20-30 (starting to accumulate input signals of a new RS codeword), and at the next clock period $C_{29,115}$ is entered into RS coder 20-1.

Directing attention specifically to a particular coder, such as RS coder 20-1, it is seen that the above-disclosed cycling procedure achieves the following:

1) it routes the input signals which belong to a particular codeword to a specific RS coder,
2) after 29 of the 4 cycle intervals, an RS coder has received the full set of 116 input signals, and
3) thereafter, the RS coder is left with no (or null) inputs for one 4 cycle interval, during which time the RS coder outputs the 4 redundant signals $C_{29,3}$, $C_{29,2}$, $C_{29,1}$, and $C_{29,0}$ to router 30.

Consequently, the stream of output signals of router 30 is in the order of the above-described input signals; to wit,

| $C_{m,119}$, | $C_{m-1,115}$, | $C_{m-2,111}, \ldots,$ | $C_{m-28,7}$, | $C_{m-29,3}$, |
|---|---|---|---|---|
| $C_{m,118}$, | $C_{m-1,114}$, | $C_{m-2,110}, \ldots,$ | $C_{m-28,6}$, | $C_{m-29,2}$, |
| $C_{m,117}$, | $C_{m-1,113}$, | $C_{m-2,109}, \ldots,$ | $C_{m-28,5}$, | $C_{m-29,1}$, |
| $C_{m,116}$, | $C_{m-1,112}$, | $C_{m-2,108}, \ldots,$ | $C_{m-28,4}$, | $C_{m-29,0}$, |
| $C_{m+1,119}$, | $C_{m,115}$, | $C_{m-1,111}, \ldots,$ | $C_{m-27,7}$, | $C_{m-28,3}$, |
| $C_{m+1,118}$, | $C_{m,114}$, | $C_{m-1,110}, \ldots,$ | $C_{m-27,6}$, | $C_{m-28,2}$, |
| $C_{m+1,117}$, | $C_{m,113}$, | $C_{m-1,109}, \ldots,$ | $C_{m-27,5}$, | $C_{m-28,1}$, |
| $C_{m+1,116}$, | $C_{m,112}$, | $C_{m-1,108}, \ldots,$ | $C_{m-27,4}$, | $C_{m-28,0}, \ldots$ | confirming that the FIG. 6 arrangement is a systematic interleaver (except that some redundant non-null signals are inserted at appropriate places).

From the above, it is seen that the appropriate cycling or routers 10 and 30 and resetting of the RS encoders are all that is necessary to implement controller 15, and such can be easily accomplished with a few counters and some combinatorial logic.

Figure 7:
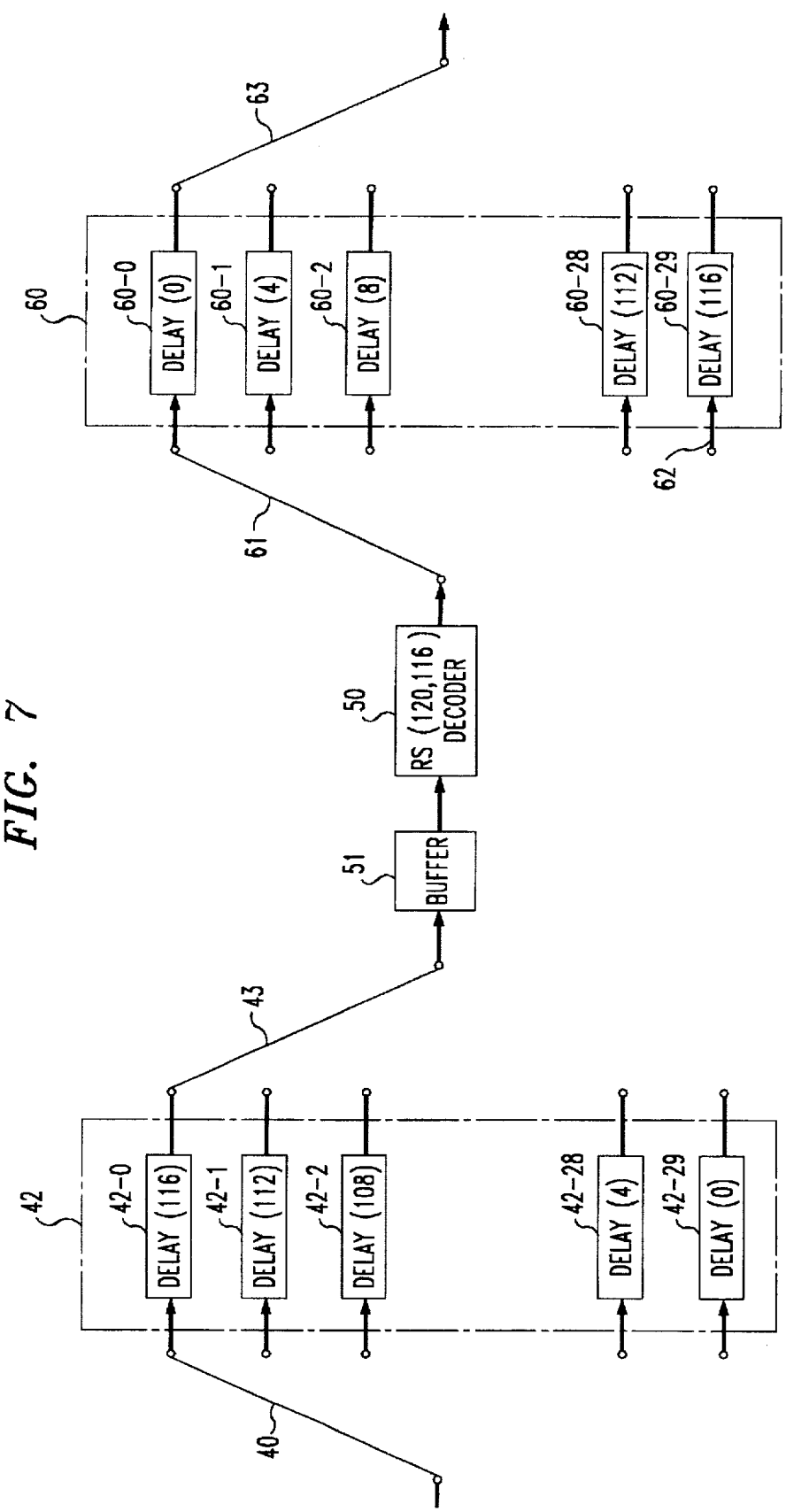
FIG. 7 illustrates a systematic convolutional deinterleaver adapted to respond to signals developed by the interleaver of FIG. 6.

FIG. 7 shows a systematic convolutional deinterleaver adapted to respond to signals developed by the interleaver of FIG. 6. The FIG. 7 arrangement includes a series connection of a switch 40, a first deinterleaver 42 comprising delay elements, a switch 43, a decoder input buffer 51, a decoder 50, a switch 61, a second deinterleaver 60 comprising delay elements, and a switch 63. Within deinterleaver 42, each delay element 42-j introduces a delay of $((116-4j) \times 30)$ signals (with j ranging from 0 to 29), and within deinterleaver 60, delay element 60-j introduces a delay of $(4j \times 30)$. Switches 40 and 43 are synchronized. Consequently, when the incoming stream of signals is arranged to insert $C_{m,119}$ into delay 42-0, the signals belonging to a particular codeword appear concurrently at the output of deinterleaver 42, allowing decoder 50 to correct errors. Of course, decoder 50 could merely raise an alarm, or simply inform the system that an error has been detected.

To be more precise, during the interval that signals $$C_{m,119}, C_{m-1,115}, C_{m-2,111}, \ldots C_{m-28,7}, C_{m-29,3},$$

are inserted into delay elements 42-0, 42-1, 42-3, . . . 42-28 and 42-29, respectively, the outputs of those delay elements correspond to $$C_{m-29,119}, C_{m-29,115}, C_{m-29,111}, \ldots C_{m-29,7}, C_{m-29,3}.$$

The following three cycles yield the signals

| $C_{m-29,118}$, | $C_{m-29,114}$, | $C_{m-29,110}, \ldots,$ | $C_{m-29,6}$, | $C_{m-29,2}$, |
|---|---|---|---|---|
| $C_{m-29,117}$, | $C_{m-29,113}$, | $C_{m-29,109}, \ldots,$ | $C_{m-29,5}$, | $C_{m-29,1}$, |
| $C_{m-29,116}$, | $C_{m-29,112}$, | $C_{m-29,108}, \ldots,$ | $C_{m-29,4}$, | $C_{m-29,0}$, | and that completes the entire codeword. Decoder 50, however, needs to process the signals sequentially, i.e., in the order $$C_{m-29,119}, C_{m-29,118}, C_{m-29,117}, \ldots$$

The task of rearranging the sequence falls to buffer 51. Thereafter, decoder 50 decodes the codeword, corrects errors (if correctable errors exist, and if that is the desired mode of operation), and outputs the corrected codeword into deinterleaver 60 which reverses the action of deinterleaver 42.

In its simplest form, buffer 51 can comprise two memories, each of which contains 120 signals. While one memory is loaded with signals, the other memory is processed by decoder 50. Decoder 50 may be a conventional decoder adapted for the code employed, which in the present disclosure is a conventional RS decoder.

Assuming that it takes decoder 50 a 120 signal interval to decode one RS codeword and, thus, when the output of deinterleaver 42 corresponds to RS codeword m-29, the output of decoder 50 corresponds to codeword m-31. Deinterleaver 60 and switches 63 and 61 recreate the stream at the input of switch 40. In sum, the arrangement of FIG. 7 injects a 31-codeword delay.

Certain general observations can be made at this point. The input signal stream, such as that shown as being applied to router 10 in FIG. 6, can be characterized as comprising N input signal sequences (where, illustratively N=30), those being the N sequences that are applied to RS coders 20-1 through 20-30. The output signal stream, such as that shown as being provided at the output of router 30, can be characterized as comprising N output signal sequences, those being the N sequences that are generated by RS coders 20-1 through 20-30. Illustratively, the same input signals that are applied to the RS coders also appear in the outputs of those coders, augmented by redundant signals. This implements a so-called systematic coder. (By contrast, in a non-systematic coder, the output signals—although equal in number to the output signals that are provided in the systematic coder case—do not include a repetition of the input signals. Rather, in general, the output signals are all different from the input signals. Use of the term "systematic" as it relates to the coders should not be confused with use that that term as it relates to the interleaving, as described herein.)

In any event, no matter whether the coding is systematic or non-systematic, one can make a generic statement about what makes the interleaving that is implemented in FIGS. 5 and 6 systematic interleaving. That generic statement is that successive input signals of each of the input signal sequences can be positionally mapped to successive output signals of the corresponding output sequence while, in addition, successive input signals of the overall input signal stream can be positionally mapped to successive signals of the overall encoded output signal stream. Such a mapping can be made even though the overall output stream includes more signals than the input stream because of the introduction of redundant signals by the RS coders. Moreover, this generic statement applies whether or not the coding is systematic or non-systematic and whether or not the coding is of the block type or is of the convolutional type, the latter being described hereinbelow.

Note, moreover, than in accordance with the invention, the separation between the successive signals in each output signal sequence is not constantly equal to the decoding depth N but, rather, is greater than the decoding depth N for at least certain successive ones of the signals in each output sequence. In particular, as can be seen by referring to FIGS. 5 and 6, the separation between each of the signals $C_{m,119}$, $C_{m,118}$, $C_{m,117}$, $C_{m,116}$, is equal to N (e.g., 30), but the separation between the signals, $C_{m,116}$ and $C_{m,115}$, is equal to (N+1) (e.g., 31). This is advantageous in that, for example, the increased average separation of the signals comprising a particular RS codeword enhances the system's ability to withstand burst errors in the channel. This increase in the average separation of the signals comprising a particular codeword of a particular output signal sequence comes at the expense of a decreased separation between the last signal of each codeword and the first signal of the following codeword in that sequence. However, since the different codewords are independently decoded, the loss of that separation does not deleteriously affect the overall ability of the system to provide accurate decoding. An overall increase in the ability to withstand burst errors in thus provided.

More particularly, the scheme represented by FIGS. 5 and 6 can be described by observing that each output signal sequence comprises a plurality of subsequences. In this embodiment, each subsequence of FIG. 6 comprises d=4 signals. That is, looking at the output sequence comprising $C_{m,119}$, $C_{m,118}$, ..., $C_{m,0}$ it can be seen to comprise the 4-signal subsequence $C_{m,119}$, $C_{m,118}$, $C_{m,117}$, $C_{m,116}$, on the topmost signal path, or "rail" of FIG. 5 followed by the 4-signal subsequence $C_{m,115}$, $C_{m,114}$, $C_{m,113}$, $C_{m,112}$, on the second-to-topmost signal path, or "rail" of FIG. 5, etc. Observe that while the signals within a subsequence are spaced from one another by N in the output signal stream of FIG. 6 the last signal of the subsequence is spaced from the first signal of the next subsequence by more than N—illustratively by (N+1).

One can also understand the arrangement of signals as represented by the example of FIGS. 5 and 6 by conceptually regarding all of the various signals as belonging to a particular one of the N parallel paths, or "rails" of FIG. 5. (It should be noted at this point that the use of the term "rail" and/or the depiction of the signals as being arranged in such rails does not imply that the signals of a particular rail can necessarily be found as appearing on different physical leads. Rather, the notion of rails is used herein as a way of defining yet another conceptual grouping of the signals in addition to their groupings into, for example, Reed-Solomon codewords.)

In particular, one can observe that the $(Nt+j)^{th}$ signal, of the output signal stream belongs to the $j^{th}$ rail, for $j=1,2,..,N$ and $t=0,1,2...$ One can also observe that each output signal sequence comprises at least one codeword. Denote the $k^{th}$ signal of the $m^{th}$ codeword as $C_{m,k}$. One can further observe that the signals of each codeword belongs to at least two different rails and the $j^{th}$ one of said N rafts comprises the signals $C_{m,x-jd+d}$ through $C_{m,x-jd+1}$ for at least one value of x (e.g., 119) and a selected value of d (e.g. 4).

In addition, it can be observed vis-a-vis the receiver arrangement of FIG. 7 that because it can be implemented with actual delay lines, e.g., hard-wire shift registers, the receiver can be operated to provide higher throughput than would typically be obtainable using a random access memory implementation to emulate the action of those delay lines, given any particular implementational technology. This facilitates the use of the invention in high-data-speed applications.

Figure 8:
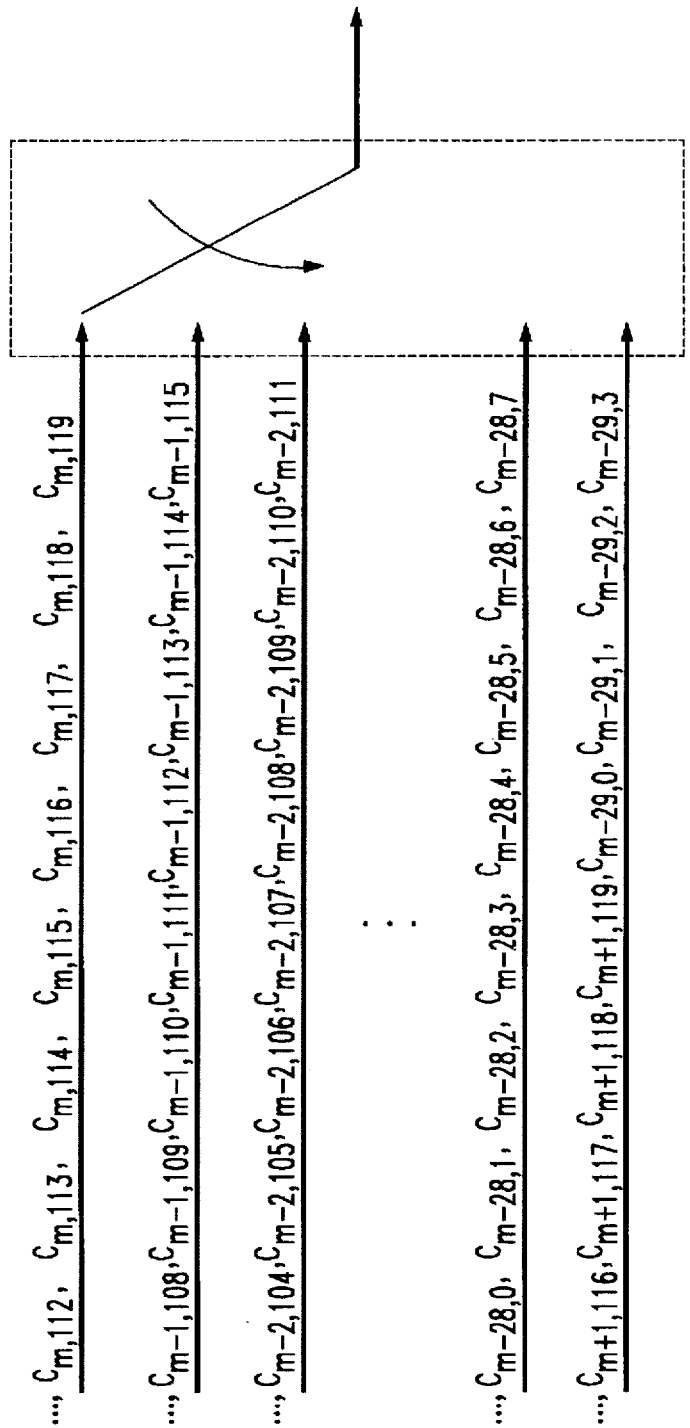
FIG. 8 presents a pictorial overview of an another illustrative stream of incoming Reed-Solomon codeword signals.

The arrangement of FIG. 5 illustrates one specific incoming stream of RS codeword signals. FIG. 8 presents an alternative assumed incoming stream, which is expressed below (again, including 4 blank, or null, redundant signals).

| | | | | |
|---|---|---|---|---|
| $C_{m,119}$, | $C_{m-1,115}$, | $C_{m-2,111}$, ..., | $C_{m-28,7}$, | $C_{m-29,3}$, |
| $C_{m,118}$, | $C_{m-1,114}$, | $C_{m-2,110}$, ..., | $C_{m-28,6}$, | $C_{m-29,2}$, |
| $C_{m,117}$, | $C_{m-1,113}$, | $C_{m-2,109}$, ..., | $C_{m-28,5}$, | $C_{m-29,1}$, |
| $C_{m,116}$, | $C_{m-1,112}$, | $C_{m-2,108}$, ..., | $C_{m-28,4}$, | $C_{m-29,0}$, |
| $C_{m,115}$, | $C_{m-1,111}$, | $C_{m-2,107}$, ..., | $C_{m-28,3}$, | $C_{m+1,119}$, |
| $C_{m,114}$, | $C_{m-1,110}$, | $C_{m-2,106}$, ..., | $C_{m-28,2}$, | $C_{m+1,118}$, |
| $C_{m,113}$, | $C_{m-1,109}$, | $C_{m-2,105}$, ..., | $C_{m-28,1}$, | $C_{m+1,117}$, |
| $C_{m,112}$, | $C_{m-1,108}$, | $C_{m-2,104}$, ..., | $C_{m-28,0}$, | $C_{m+1,116}$, ... |

This input stream is similar to the stream suggested by Gallager, except for the very crucial difference that the starting points of the different RS codewords are staggered. Thus, instead of developing a block interleaving, what is accomplished is convolutional interleaving.

The macro structure of an encoder responsive to the signal depicted in FIG. 8 is the same as the one depicted in FIG. 6. However, the control of the router and the RS decoders is different.

To review, in connection with the FIG. 5, the input signals are first inserted into coders 20-30 through 20-29, skipping coder 20-30 for 4 cycles and router 30 cycles coders 20-1 through 20-30 for the 4 cycles. Thereafter, the very next byte is inserted in coder 20-30, the following byte is inserted into coder 20-1, and for the next 4 cycles coder 20-29 is skipped and router 30 cycles through coders 20-30 through 20-29 for the 4 cycles.

In connection with the FIG. 8 signal, the input signals are also first inserted into coders 20-1 through 20-29, skipping coder 20-30 for 4 cycles. The very next input signal is again entered into coder 20-30, coder 20-29 is skipped when its turn arrives. However, and in contradiction, router 30 cycles through coders 20-1 through 20-30 for every cycle.

It may be noted that in both FIGS. 5 and 8, encoders RS(n,n-r) may be used with any r, 0<r<n. The number of encoders is determined by the interleaving depth, which is chosen to be 30 throughout the text. The interleaving depth certainly does not have to be 30. It has nothing to do with the amount of redundancy r. Furthermore, it can be chosen to be independent of the length n of the RS code (n is chosen to be 120 throughout the text), although for some n's the interleaver and deinterleaver based on FIG. 5 can have a nice structure.

It may be further noted that a number of practical design considerations that are commonly encountered in coder and decoder designs such as described here have not been presented here, for sake of brevity. For example, it may be noted that the signal coming into router 10 has a slightly different rate than the signal exiting router 30. Specifically, in the same time frame there are 116 signals coming in and 120 signals going out. This slight rate change is conventionally accounted for by providing a buffer in block 20; specifically, one signal delay in each encoder would suffice. There is a corresponding rate change in the deinterleaver between the signal at switch 40 and the signal at switch 63.

Whereas the hardware embodiment presented suggests delay lines, it should be understood that other storage media, such as semiconductor memories, can be used with identical effectiveness. Also, it should be understood that although this disclosure employed Reed-Solomon coding, other coding approaches can also be used.

The invention is disclosed herein in the context of so-called block encoding, of which Reed-Solomon coding is an example. In block coding arrangements, a predetermined number of coder output signals comprise a codeword which can be decoded without reference to any other outputs of the encoder. In the example herein, for example, that number of coder output signals is 120. However, the invention is not limited to being used in conjunction with block codes. Rather, as alluded to hereinabove, it can also be used in arrangements in which the encoding is, for example, so-called convolutional coding. (The latter is not to be confused with convolutional interleaving, which is defined hereinabove and relates to the manner in which the coder outputs are arranged in the output signal stream.) In a convolutional coder, such as a so-called trellis coder, no particular group of coder output signals can be segmented from the output stream and decoded. In this sense, the coder output word is of indefinite length.

Although in the the illustrative embodiment various functional elements are disclosed as being discrete entities and, indeed, could be implemented as such, it will be recognized by those skilled in the art that any one or more of those elements could be realized, for example, in the form of one or more general purpose or special purpose processors which have been programmed to perform the functions involved.

The numerical values for various parameters used herein are, of course, illustrative and can be chosen to fit the needs of any particular system embodying the invention.

It will thus be realized, more generally, that although the invention is disclosed herein in the context of particular embodiments, those skill in the art will be able to devise numerous other arrangements which, although not explicitly shown or described herein, embody the principles of the invention and are within its spirit and scope.

The invention claimed is:

1. A method of encoding a stream of input signals to generate a stream of encoded output signals, the input signal stream comprising N input signal sequences and the output signal stream comprising N output signal sequences, each of the output signal sequences being generated in response to a corresponding one of the input signal sequences using at least a first predetermined redundancy code, the encoding being such that successive input signals of each of the input sequences can be positionally mapped to successive output signals of the corresponding output sequence while, in addition, successive input signals of the input signal stream can be positionally mapped to successive signals of the encoded output signal stream, characterized in that at least certain successive ones of the signals in each output sequence are spaced from one another within the output signal stream by more than N.

2. The method of claim 1 wherein each of the output signal sequences comprises a plurality of the subsequences and wherein, for at least one value of i, the $i^{th}$ subsequence comprises $S_i$ signals which are spaced from one another in said output signal stream by N, and the last signal of said $i^{th}$ subsequence is spaced from the first signal of the $(i+1)^{st}$ subsequence by more than N.

3. A method of generating an output signal stream comprising N encoded output signal sequences, each output signal sequence corresponding to one of N input signal sequences, said arrangement utilizing redundancy encoding and implied systematic convolutional interleaving to generate the output signal stream, characterized in that at least certain successive ones of the signals in each encoded output signal sequence are spaced from one another within the output signal stream by more than N.

4. The method of claim 3 wherein each of the output signal sequences comprises a plurality of subsequences and wherein, for at least one value of i, the $i^{th}$ subsequence comprises $S_i$ signals which are spaced from one another in said output signal stream by N, and the last signal of said $i^{th}$ subsequence is spaced from the first signal of the $(i+1)$st subsequence by more than N.

5. A method of encoding an ordered stream of input signals to develop a stream of output signals, said stream of output signals comprising said stream of input signals in its original order combined with an associated plurality of redundant signals, each of the redundant signals being a function of a predetermined group of said input signals as defined by at least a first predetermined redundance code, the output signals belonging to each said group, as well as the associated redundant signals, appearing in said output stream with non-uniform spacing.

6. A method of encoding a stream of input signals to generate a stream of encoded output signals, the input signal stream comprising N input signal sequences and the output signal stream comprising N output signal sequences, each of the output signal sequences being generated in response to a corresponding one of the input signal sequences using at least a first predetermined redundancy code, the encoding being such that successive input signals of each of the input sequences can be positionally mapped to successive output signals of the corresponding output sequence while, in addition, successive input signals of the input signal stream can be positionally mapped to successive signals of the encoded output signal stream, the $(NT+j)^{th}$ signal of the output signal stream belonging to the $j^{th}$ one of N rails, j=1,2, ..., N and t=0,1,2, ..., characterized in that the signals of each output signal sequence belong to at least two different rails.

7. The method of claim 6 wherein each output signal sequence comprises at least one codeword, the $k^{th}$ signal of the $m^{th}$ codeword being $C_{m,k}$, characterized in that the $j^{th}$ one of said N rails comprises the signals $C_{m,X-jd+d}$ through $C_{m,X-jd+1}$ for at least one value of X and a selected value of d.

8. A method for use in a system in which a stream of input signals is encoded to generate a stream of encoded output signals, the input signal stream comprising N input signal sequences and the output signal stream comprising N output signal sequences, each of the output signal sequences being generated in response to a corresponding one of the input signal sequences using at least a first predetermined redundancy code, the encoding being such that successive input signals of each of the input sequences can be positionally mapped to successive output signals of the corresponding output sequence while, in addition, successive input signals of the input signal stream can be positionally mapped to successive signals of the encoded output signal stream, the method comprising the steps of receiving said stream of encoded output signals, and decoding the received stream of encoded output signals to recover said stream of input signals, characterized in that at least certain successive ones of the signals in each output sequence are spaced from one another within the output signal stream by more than N.

9. The method of claim 8 wherein each of the output signal sequences comprises a plurality of subsequences and wherein, for at least one value of i, the $i^{th}$ subsequence comprises $S_{ii}$ signals which are spaced from one another in said output signal stream by N, and the last signal of said $i^{th}$ subsequence is spaced from the first signal of the $(i+1)^{st}$ subsequence by more than N.

10. A method for use in a receiver of a system in which an output signal stream comprising N encoded output signal sequences is generated and transmitted to said receiver, each output signal sequence corresponding to one of N input signal sequences, said system being of a type which utilizes redundancy encoding and implied systematic convolutional interleaving to generate the output signal stream, the method comprising the steps of receiving said output signal stream, and recovering said N input signal sequences therefrom using redundancy decoding and convolutional deinterleaving, characterized in that at least certain successive ones of the signals in each encoded output signal sequence are spaced from one another within the output signal stream by more than N.

11. The method of claim 10 wherein each of the output signal sequences comprises a plurality of subsequences and wherein, for at least one value of i, and the $i^{th}$ subsequence comprises $S_i$ signals which are spaced from one another in said output signal stream by N; and the last signal of said $i^{th}$ subsequence is spaced from the first signal of the $(i+1)^{st}$ subsequence by more than N.

12. A method comprising the step of recovering an ordered stream of input signals from a transmitted stream of output signals which was generated by encoding said ordered stream of input signals, said stream of output signals comprising said stream of input signals in its original order combined with an associated plurality of redundant signals, each of the redundant signals being a function of a predetermined group of said input signals as defined by at least a first predetermined redundancy code, the output signals belonging to each said group, as well as the associated redundant signals, appearing in said output stream with non-uniform spacing.

13. A method for use in a system in which a stream of input signals is encoded to generate a stream of encoded output signals, the input signal stream comprising N input signal sequences and the output signal stream comprising N output signal sequences, each of the output signal sequences being generated in response to a corresponding one of the input signal sequences using at least a first predetermined redundancy code, the encoding being such that successive input signals of each of the input sequences can be positionally mapped to successive output signals of the corresponding output sequence while, in addition, successive input signals of the input signal stream can be positionally mapped to successive signals of the encoded output signal stream, the $(NT+j)^{th}$ signal of the output signal stream belonging to the $j^{th}$ one of N rails, j=1,2, . . . , N and t=0,1,2, . . . , the method comprising the steps of receiving said stream of encoded output signals, and decoding the received stream of encoded output signals to recover said stream of input signals, characterized in that the signals of each output signal sequence belong to at least two different rails.

14. The method of claim 13 wherein each output signal sequence comprises at least one codeword, the $k^{th}$ signal of the $m^{th}$ codeword being $C_{m,k}$, characterized in that the jth one of said N rails comprises the signals $C_{m,x-jd+d}$ through $C_{m,x-jd+1}$ for at least one value of X and a selected value of d.

15. A method for use in a receiver to which is transmitted a stream of encoded output signals that was generated by encoding a stream of input signals, the input signal stream comprising N input signal sequences and the output signal stream comprising N output signal sequences, each of the output signal sequences being generated in response to a corresponding one of the input signal sequences using at least a first predetermined redundancy code, the encoding being such that successive input signals of each of the input sequences can be positionally mapped to successive output signals of the corresponding output sequence while, in addition, successive input signals of the input signal stream can be positionally mapped to successive signals of the encoded output signal stream, each output signal sequence comprising at least one codeword, the $k^{th}$ signal of the $m^{th}$ codeword being $C_{m,k}$, the $(Nt+j)^{th}$ signal of the output signal stream belonging to the $j^{th}$ one of N rails, j=1,2, . . . , N and t=0,1,2, . . . , the $j^{th}$ one of said rails comprising the signals $C_{m,x-jd+d}$ through $C_{m,x-jd+1}$ for at least one value of X and a selected value of d, the method comprising the steps of receiving the transmitted stream of encoded output signals, applying those signals in the received transmitted stream which comprise at least the $1^{st}$ through $N^{th}$ rails to $1^{st}$ through $N^{th}$ first delay lines, respectively, the length of the $j^{th}$ first delay line being dN signal periods greater than the delay amount for the $(j+1)^{st}$ first delay line for 0<j<N, assembling the outputs of said first delay lines into groups of signals each comprising the signals of a respective one of said codeword, decoding each of said groups of signals in a redundancy decoder, and applying successive decoded outputs from said redundancy decoder to respective $1^{st}$ through N second delay lines, respectively, the length of the $j^{th}$ second delay line being dN signal periods less than the delay amount for the $(j+1)^{st}$ second delay line for 0<j<N, and recovering said stream of input signals, in their original order, by applying individual outputs from said second delay lines, in sequence, to an output.

* * * * *